United States Patent
Kim et al.

(10) Patent No.: US 10,812,113 B2
(45) Date of Patent: Oct. 20, 2020

(54) METHOD OF DETECTING AND CORRECTING ERROR IN MESH AND APPARATUS FOR SAME

(71) Applicant: ELECTRONICS AND TELECOMMUNICATIONS RESEARCH INSTITUTE, Daejeon (KR)

(72) Inventors: Kap Kee Kim, Daejeon (KR); Il Kyu Park, Daejeon (KR); Chang Joon Park, Daejeon (KR); Jin Sung Choi, Daejeon (KR)

(73) Assignee: ELECTRONICS AND TELECOMMUNICATIONS RESEARCH INSTITUTE, Daejeon (KR)

(*) Notice: Subject to any disclaimer, the term of this patent is extended or adjusted under 35 U.S.C. 154(b) by 9 days.

(21) Appl. No.: 16/121,387

(22) Filed: Sep. 4, 2018

(65) Prior Publication Data

US 2019/0074853 A1    Mar. 7, 2019

(30) Foreign Application Priority Data

Sep. 5, 2017  (KR) .................. 10-2017-0113262
Jul. 20, 2018  (KR) .................. 10-2018-0084500

(51) Int. Cl.
*H03M 13/47* (2006.01)
*B29C 64/386* (2017.01)
*B33Y 50/00* (2015.01)
*G06T 17/20* (2006.01)

(52) U.S. Cl.
CPC .......... *H03M 13/47* (2013.01); *B29C 64/386* (2017.08); *B33Y 50/00* (2014.12); *G06T 17/20* (2013.01)

(58) Field of Classification Search
CPC ..................................................... H03M 13/47
USPC ........................................................ 714/746
See application file for complete search history.

(56) References Cited

U.S. PATENT DOCUMENTS

| | | | |
|---|---|---|---|
| 7,984,430 B2 | 7/2011 | Sohn et al. | |
| 9,607,419 B2 | 3/2017 | Kim et al. | |
| 2005/0249426 A1* | 11/2005 | Badawy | G06T 9/001 |
| | | | 382/241 |
| 2012/0190380 A1* | 7/2012 | Dupray | G01S 1/026 |
| | | | 455/456.1 |

FOREIGN PATENT DOCUMENTS

| | | |
|---|---|---|
| JP | 2001022956 A | 1/2001 |
| KR | 1020020094830 A | 12/2002 |

(Continued)

OTHER PUBLICATIONS

"Identifying and Repairing Common Mesh Errors", Simplify 3D, Jan. 25, 2018, pp. 1-4, https://www.simplify3d.com/support/articles/identifying-and-repairing-common-mesh-errors/.

*Primary Examiner* — Fritz Alphonse

(57) ABSTRACT

Disclosed is a method of detecting and correcting an error in a 3D mesh model. According to the present disclosure, the method includes: determining at least one mesh on the basis of half-edge information; setting at least one cluster including the at least one mesh, on the basis of normal vector information on the at least one mesh; detecting a flip error of the at least one cluster; and correcting the at least one mesh in the at least one cluster in which the flip error is detected.

20 Claims, 7 Drawing Sheets

(56) References Cited

FOREIGN PATENT DOCUMENTS

| KR | 1020080007114 A | 1/2008 |
|----|-----------------|--------|
| KR | 20090042243 A   | 4/2009 |
| KR | 1020120085134 A | 7/2012 |
| KR | 20140098592 A   | 8/2014 |
| KR | 20160073147 A   | 6/2016 |

* cited by examiner

FIG. 4

| Cluster identifier | Mesh identifier | Mesh list |
|---|---|---|
| 1 | M1 | V0 V4 V5 |
| | M2 | V0 V5 V1 |
| | M3 | V1 V5 V6 |
| | M4 | V1 V6 V2 |
| | M5 | V2 V6 V7 |
| | M6 | V2 V7 V3 |
| | M7 | V3 V7 V4 |
| | M8 | V3 V4 V0 |
| | M9 | V8 V5 V4 |
| 2 | M10 | V8 V6 V5 |
| | M11 | V8 V7 V6 |
| | M12 | V8 V4 V7 |
| | M13 | V9 V5 V4 |
| | M14 | V9 V6 V5 |
| | ⋮ | ⋮ |

| Cluster identifier | Mesh identifier | Mesh list |
|---|---|---|
| 1 | M1 | V0 V4 V5 |
| | M2 | V0 V5 V1 |
| | M3 | V1 V5 V6 |
| | M4 | V6 V1 V2 |
| | M5 | V2 V6 V7 |
| | M6 | V2 V7 V3 |
| | M7 | V3 V7 V4 |
| | M8 | V3 V4 V0 |
| | M9 | V8 V5 V4 |
| 2 | M10 | V6 V8 V5 |
| | M11 | V7 V8 V6 |
| | M12 | V4 V8 V7 |
| | M13 | V5 V9 V4 |
| | M14 | V6 V9 V5 |
| | ⋮ | ⋮ |

Correction of mesh flip

METHOD OF DETECTING AND CORRECTING ERROR IN MESH AND APPARATUS FOR SAME

CROSS REFERENCE TO RELATED APPLICATION

The present application claims priority to Korean Patent Applications No. 10-2017-0113262, filed Sep. 5, 2017, and No. 10-2018-0084500, filed Jul. 20, 2018, the entire contents of which is incorporated herein for all purposes by this reference.

BACKGROUND OF THE INVENTION

Field of the Invention

The present disclosure relates generally to three-dimensional data processing technology. More particularly, the present disclosure relates to a method and apparatus for detecting and correcting an error in three-dimensional data used in three-dimensional printing.

Description of the Related Art

Three-dimensional data configured for screen display (hereinafter, referred to as three-dimensional display data) is intended to output an object on a screen and has been developed as focusing on expressing or displaying the appearance of the object. Accordingly, the three-dimensional display data is configured to efficiently and accurately express the appearance of the object on the display, and is configured not to include unnecessary information in expressing the appearance of the object.

For example, the three-dimensional display data may be configured not to express fine holes that are relatively smaller than the resolution of the display, or may not include information related to the thickness of the object.

In the meantime, three-dimensional data (hereinafter, referred to as three-dimensional printing data) configured for three-dimensional printing is intended to form a physically-present object and is required to pass relatively stricter standards than the three-dimensional display data in terms of mesh topology.

The foregoing is intended merely to aid in the understanding of the background of the present disclosure, and is not intended to mean that the present disclosure falls within the purview of the related art that is already known to those skilled in the art.

SUMMARY OF THE INVENTION

Particularly, the three-dimensional printing data fundamentally requires information related to the thickness of the object. The thickness of the object may be expressed using a normal vector on a per-mesh basis, and the three-dimensional printing data may be configured to include normal vector information on a per-mesh basis.

The normal vector information may be directly input by a user, or may be actively generated on the basis of a preset algorithm. In the process of inputting or generating the normal vector information into the three-dimensional printing data, there is likelihood that an error may occur in the direction of the normal vector.

Accordingly, the present disclosure is intended to propose a method and apparatus for automatically detecting and correcting an error in mesh information contained in three-dimensional printing data.

Also, the present disclosure is intended to propose a method and apparatus for automatically detecting and correcting a flip error in a mesh on the basis of mesh information and normal vector information contained in three-dimensional printing data.

It is to be understood that technical problems to be solved by the present disclosure are not limited to the aforementioned technical problems and other technical problems which are not mentioned will be apparent from the following description to a person with an ordinary skill in the art to which the present disclosure pertains.

In order to achieve the above object, according to one aspect of the present disclosure, there is provided a method of detecting an error in a mesh model, the method including: determining at least one mesh on the basis of half-edge information; setting at least one cluster including the at least one mesh, on the basis of normal vector information on the at least one mesh; detecting a flip error of the at least one cluster; and correcting the at least one mesh in the at least one cluster in which the flip error is detected.

According to another aspect of the present disclosure, there is provided an apparatus for detecting an error in a mesh model, the apparatus including: a mesh determining unit determining at least one mesh on the basis of half-edge information; a clustering processing unit setting at least one cluster including the at least one mesh, on the basis of normal vector information on the at least one mesh; an error detecting unit detecting a flip error of the at least one cluster; and an error correcting unit correcting the at least one mesh in the at least one cluster in which the flip error is detected.

It is to be understood that the foregoing summarized features are exemplary aspects of the following detailed description of the present disclosure without limiting the scope of the present disclosure.

According to the present disclosure, the method and apparatus for automatically detecting and correcting an error in mesh information contained in three-dimensional printing data may be provided.

Also, according to the present disclosure, the method and apparatus for automatically detecting and correcting a flip error in a mesh on the basis of mesh information and normal vector information contained in three-dimensional printing data may be provided.

Also, according to the present disclosure, by automatically detecting and correcting the flip error in the mesh, precise three-dimensional printing data may be constructed, and on the basis thereof, a three-dimensional printing object may be generated with high quality.

Effects that may be obtained from the present disclosure will not be limited to only the above described effects. In addition, other effects which are not described herein will become apparent to those skilled in the art from the following description.

BRIEF DESCRIPTION OF THE DRAWINGS

The above and other objects, features and other advantages of the present disclosure will be more clearly understood from the following detailed description when taken in conjunction with the accompanying drawings, in which:

FIG. 4 is a diagram illustrating an example of an operation of correcting an error in a mesh by an apparatus for detecting an error in a mesh model according to an embodiment of the present disclosure;

DETAILED DESCRIPTION OF THE INVENTION

Figure 1:
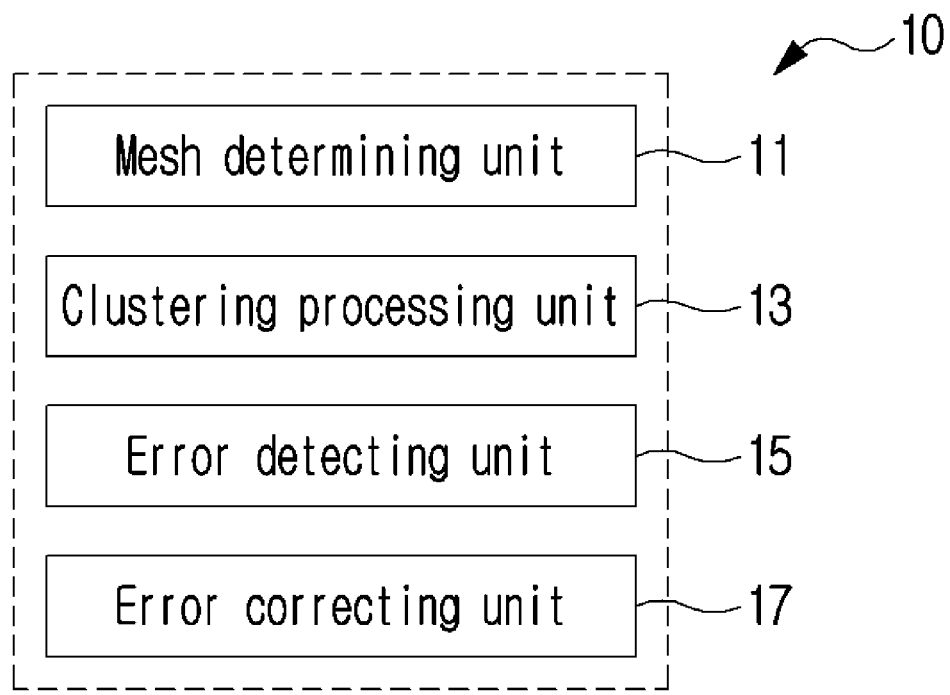
FIG. 1 is a block diagram illustrating an example of an apparatus for detecting an error in a mesh model according to an embodiment of the present disclosure.

Hereinbelow, exemplary embodiments of the present disclosure will be described in detail with reference to the accompanying drawings such that the present disclosure can be easily embodied by one of ordinary skill in the art to which this invention belongs. However, the present disclosure may be variously embodied, without being limited to the exemplary embodiments.

In the description of the present disclosure, the detailed descriptions of known constitutions or functions thereof may be omitted if they make the gist of the present disclosure unclear. Also, portions that are not related to the present disclosure are omitted in the drawings, and like reference numerals designate like elements.

In the present disclosure, when an element is referred to as being "coupled to", "combined with", or "connected to" another element, it may be connected directly to, combined directly with, or coupled directly to another element or be connected to, combined directly with, or coupled to another element, having the other element intervening therebetween. Also, it should be understood that when a component "includes" or "has" an element, unless there is another opposite description thereto, the component does not exclude another element but may further include the other element.

In the present disclosure, the terms "first", "second", etc. are only used to distinguish one element, from another element. Unless specifically stated otherwise, the terms "first", "second", etc. do not denote an order or importance. Therefore, a first element of an embodiment could be termed a second element of another embodiment without departing from the scope of the present disclosure. Similarly, a second element of an embodiment could also be termed a first element of another embodiment.

In the present disclosure, components that are distinguished from each other to clearly describe each feature do not necessarily denote that the components are separated. That is, a plurality of components may be integrated into one hardware or software unit, or one component may be distributed into a plurality of hardware or software units. Accordingly, even if not mentioned, the integrated or distributed embodiments are included in the scope of the present disclosure.

In the present disclosure, components described in various embodiments do not denote essential components, and some of the components may be optional. Accordingly, an embodiment that includes a subset of components described in another embodiment is included in the scope of the present disclosure. Also, an embodiment that includes the components described in the various embodiments and additional other components are included in the scope of the present disclosure.

Hereinbelow, exemplary embodiments of the present disclosure will be described in detail with reference to the accompanying drawings.

FIG. 1 is a block diagram illustrating an example of an apparatus for detecting an error in a mesh model according to an embodiment of the present disclosure.

Referring to FIG. 1, the apparatus 10 for detecting an error in a mesh model according to the embodiment of the present disclosure may include a mesh determining unit 11, a clustering processing unit 13, an error detecting unit 15, and an error correcting unit 17.

The mesh determining unit 11 may determine three-dimensional polygon mesh information. The three-dimensional polygon mesh information may contain a data file used in printing of a three-dimensional object, and further, may contain a data file configured in half-edge data structure.

In a three-dimensional data structure, a face or a mesh bounded by edges connecting multiple (for example, three) vertices may be constructed, and a polygon may be constructed in combination of one or more faces. Further, the mesh bounded by multiple vertices and edges may be expressed in the half-edge data structure using half-edges.

Figure 2A:
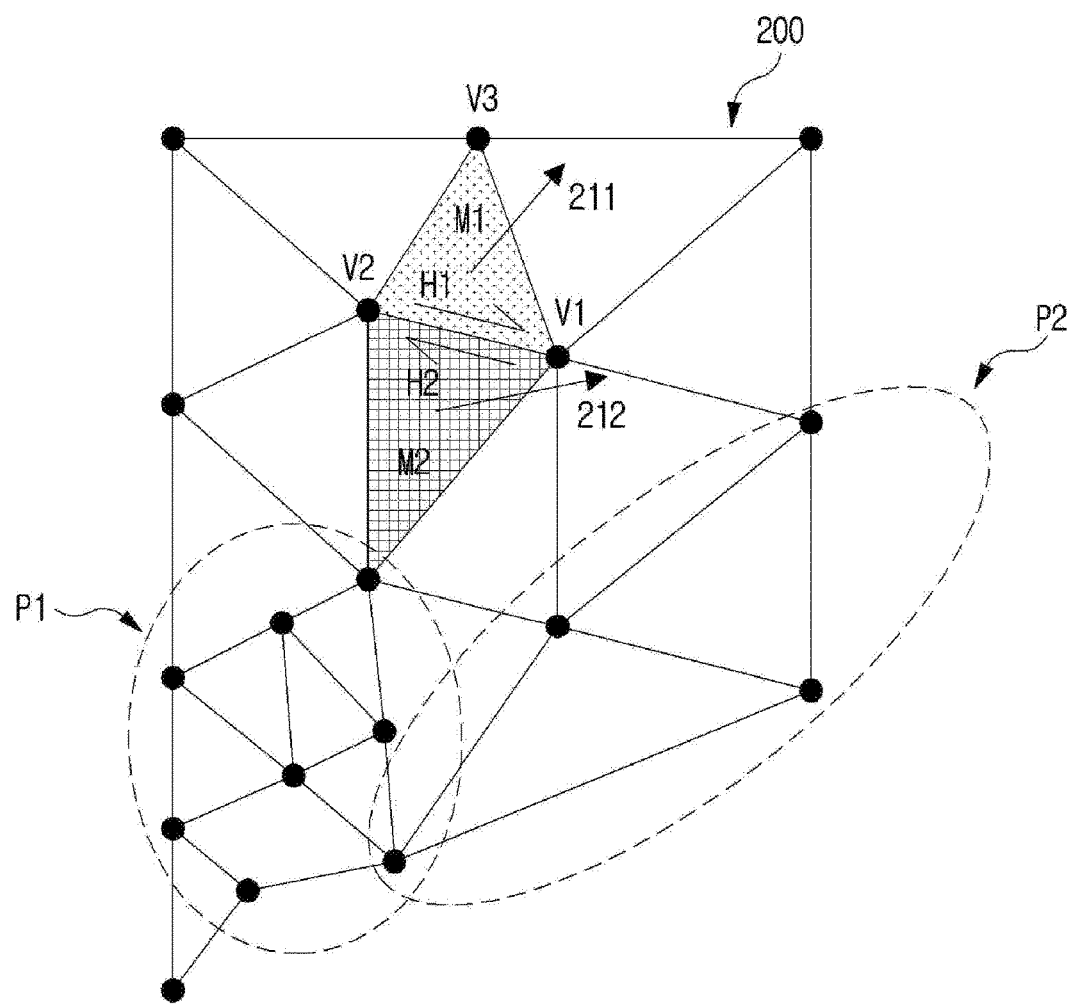
FIGS. 2A and 2B are diagrams illustrating examples of mesh structures processed by an apparatus for detecting an error in a mesh model according to an embodiment of the present disclosure.

For example, as shown in FIG. 2A, on the basis of the half-edge data structure, a predetermined object 200 may be expressed in a structure including: vertices V1, V2, . . . , and Vn; polygons P1, P2, . . . , and Pn; meshes M1, M2, . . . , and Mn; and half-edges H1, H2, . . . , and Hn. On the basis thereof, the mesh determining unit 11 may determine the three-dimensional polygon mesh information that contains information indicating the vertices V1, V2, . . . , and Vn, the polygons P1, P2, . . . , and Pn, the meshes M1, M2, . . . , and Mn, and the half-edges H1, H2, and Hn, namely, vertex information, polygon information, mesh information, and half-edge information.

Further, each mesh may represent a direction, and the direction of the mesh may be expressed using a normal vector. Accordingly, on the basis of the normal vector of each mesh, half-edges H1, H2, . . . , and Hn of the relevant mesh may be determined.

For example, as shown in FIG. 2A, when a first mesh M1 is provided with a first direction 211, there may be a first half-edge H1 toward a first vertex V1 from a second vertex V2. Further, when a second mesh M2 adjacent to the first mesh M1 is provided with a second direction 212 similar to the first direction 211, there is a second half-edge H2 toward the second vertex V2 from the first vertex V1.

Figure 2B:
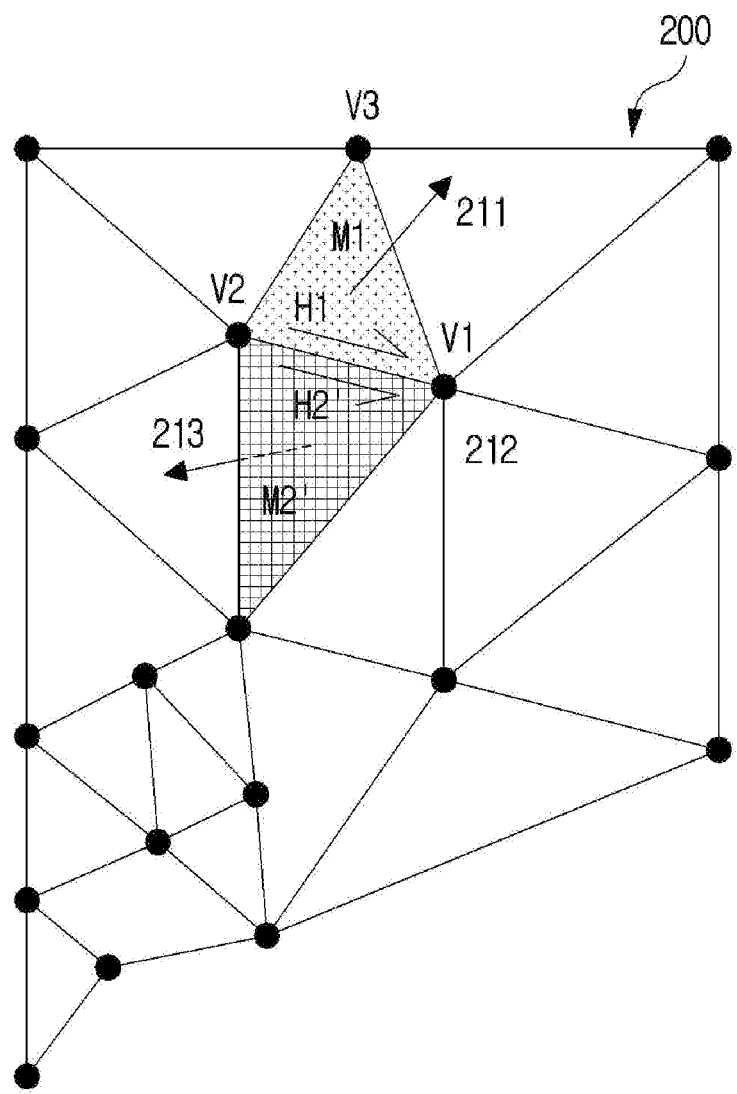

In contrast, as shown in FIG. 2B, the first half-edge H1 of the first mesh M1 may be the half-edge toward the first vertex V1 from the second vertex V2 as described above. Further, when a second' mesh M2' adjacent to the first mesh M1 is provided with a third direction 213 opposite to the first direction 211, a second' half-edge H2' is a half-edge toward the first vertex V1 from the second vertex V2.

Considering the above-described half-edge structure, the clustering processing unit 13 may perform clustering on each of one or more meshes. For example, the clustering processing unit 13 may determine normal vector information on a per-mesh basis and may set a cluster including one or more meshes.

Further, the clustering processing unit 13 may perform clustering in stages. That is, the clustering processing unit may construct an initial cluster including one or more meshes first, and may construct a final cluster including one or more initial clusters second.

Specifically, the clustering processing unit 13 determines whether one or more meshes are connected to each other on the basis of the half-edge information on at least one mesh. Further, the clustering processing unit 13 may construct at least one initial cluster applying whether one or more meshes are connected to each other.

For example, referring to FIGS. 2A and 2B, when the first mesh M1 and the second mesh M2 adjacent thereto are provided with the same direction, the edge used in the two meshes in common is expressed as half-edges facing in different directions, and the relevant half-edges, namely, the first half-edge H1 and the second half-edge H2, may be grouped into one pair. In contrast, when the first mesh M1 and the second' mesh M2' adjacent thereto are provided with opposite directions, the edge used in the two meshes in common is expressed as half-edges facing the same direction, and the relevant half-edges, namely, the first half-edge H1 and the second' half-edge H2', are not grouped into one pair.

On the basis of this, the clustering processing unit 13 may construct the initial cluster by combining one or more meshes including half-edges grouped into one pair.

Further, the clustering processing unit 13 may determine the initial clusters or the normal vectors of the meshes included in the initial clusters, and may construct the final cluster by merging or separating the initial clusters considering the determine normal vectors.

Figure 3:
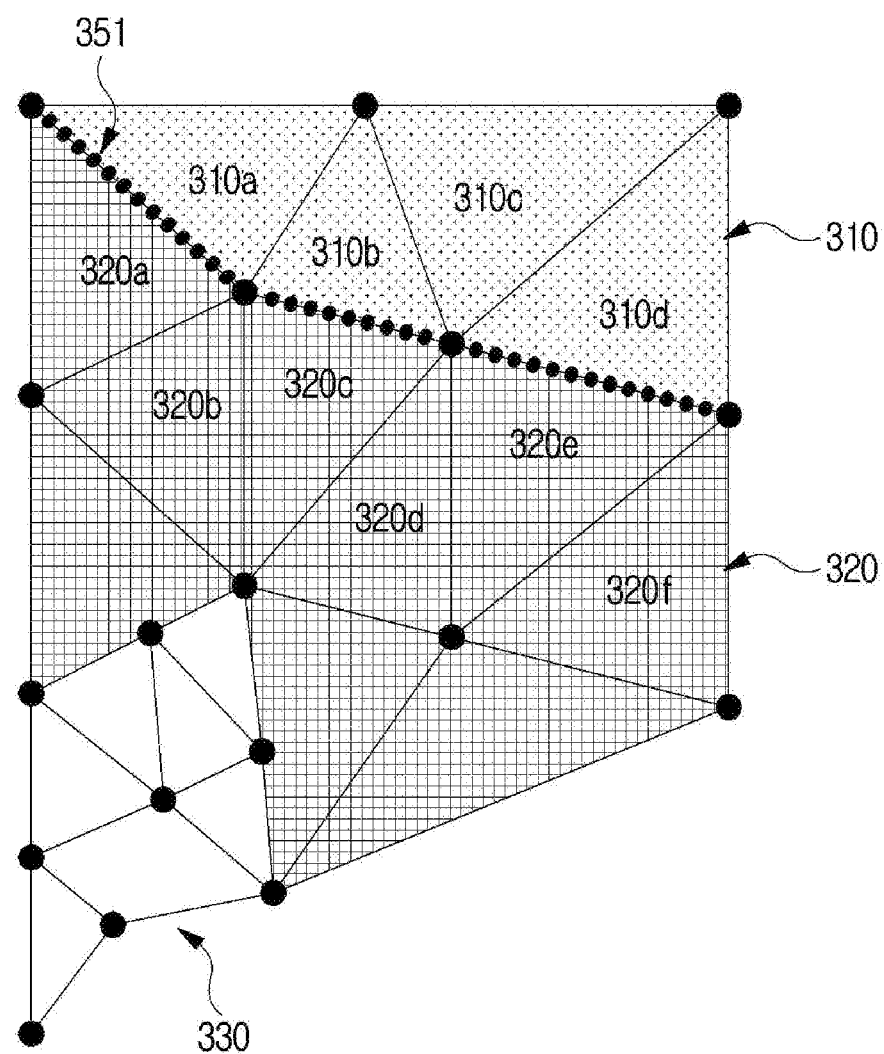
FIG. 3 is a diagram illustrating an example of a cluster structure processed by an apparatus for detecting an error in a mesh model according to an embodiment of the present disclosure.

For example, as shown in FIG. 3, there are multiple initial clusters 310, 320, 330, . . . , and each of the initial clusters 310, 320, 330, . . . includes multiple meshes. A first initial cluster 310 is adjacent to a second initial cluster 320, and the region in which the first initial cluster 310 is in contact with the second initial cluster 320 is referred to as a boundary region 351. Considering this, the clustering processing unit 13 may determine, among multiple meshes included in the first initial cluster 310, one or more meshes 310a, 310b, 310c, and 310d that are in contact with the boundary region 351, and may determine, among multiple meshes included in the second initial cluster 320, one or more meshes 320a, 320b, 320c, 320d, 320e, and 320f that are in contact with the boundary region 351. Also, the clustering processing unit 13 may determine an average value (hereinafter, referred to as "a first average value") of normal vectors with respect to the meshes 310a, 310b, 310c, and 310d included in the first initial cluster 310, may determine an average value (hereinafter, referred to as "a second average value") of normal vectors with respect to the meshes 320a, 320b, 320c, 320d, 320e, and 320f included in the second initial cluster 320, and may determine an angle between the first average value and the second average value.

The clustering processing unit 13 may compare the determined angle with a preset reference value and may determine whether to construct a final cluster by merging the first initial cluster 310 and the second initial cluster 320 or to construct a final cluster by separating the first initial cluster 310 from the second initial cluster 320.

Further, the preset reference value may be set on the basis of distribution of the normal vectors of the meshes included in the initial cluster. The preset reference value is for setting initial clusters, which include meshes having similar normal vectors, as the same cluster, so it may be a reference value for merging adjacent initial clusters into a single final cluster. The preset reference value may be set using the minimum or maximum value of the angle between the normal vectors of one or more meshes included in the same cluster. As another example, the preset reference value may be set on the basis of the average value and the standard distribution of angles between normal vectors of one or more meshes included in the same cluster.

In the meantime, as described above, when the cluster is set by the clustering processing unit 13, the error detecting unit 15 determines whether there is an error in every set cluster.

For example, the error detecting unit 15 may determine the normal vector of at least one mesh included in the final cluster, and may determine for an error using the determined normal vector of the mesh. Specifically, the error detecting unit 15 may select, among the meshes included in the final cluster, a mesh to be referenced (hereinafter, referred to as "a reference mesh"), and may determine whether there is an error in every final cluster on the basis of the number of meshes that are in contact with the normal vector of the selected reference mesh. That is, when number of meshes, which are in contact with the extending line from the normal vector of the reference mesh, is zero or an even number ($2n$), the error detecting unit 15 determines that the relevant final cluster is in a normal direction. In contrast, when the number of meshes, which are in contact with the extending line from the normal vector of the reference mesh, is an odd number ($2n+1$), the error detecting unit 15 determines that there is an error in the relevant final cluster.

Further, the error detecting unit 15 may determine the mesh closest to the central region of the final cluster as the reference mesh. As another example, the error detecting unit 15 may calculate the average value of the normal vectors of all meshes included in the final cluster, and may determine the mesh having the normal vector closest to the average value of the normal vectors as the reference mesh.

Additionally, there may be multiple initial clusters, and the clustering processing unit 13 may construct the final cluster by merging or separating the multiple initial clusters. Preferably, the clustering processing unit 13 may further perform an operation of arranging the multiple initial clusters in ascending order on the basis of the number of meshes included in the initial clusters. Also, the clustering processing unit 13 may determine the final cluster sequentially with respect to the multiple initial clusters arranged in ascending order.

Similarly, there may be multiple final clusters, and the error detecting unit 15 may determine sequentially whether there is an error in the multiple final clusters. Preferably, the error detecting unit 15 may arrange the multiple final clusters in ascending order on the basis of the number of meshes included therein, and may determine sequentially whether there is an error in the multiple final clusters arranged in ascending order.

In the meantime, the error correcting unit 17 may correct an error in the cluster that is determined as being in error. The correcting of the error in the cluster may be intended to correct a flip of the mesh. On the basis this, the error correcting unit 17 may determine the mesh of the cluster determined as being in error and may change the order of the vertices that make up the relevant mesh. For example, referring to FIG. 4, when there is an error in a second cluster, the error correcting unit 17 changes the order of vertices that make up one or more meshes M10, M11, M12, M13, and M14 included in the second cluster, thereby correcting a flip of the mesh.

Figure 5:
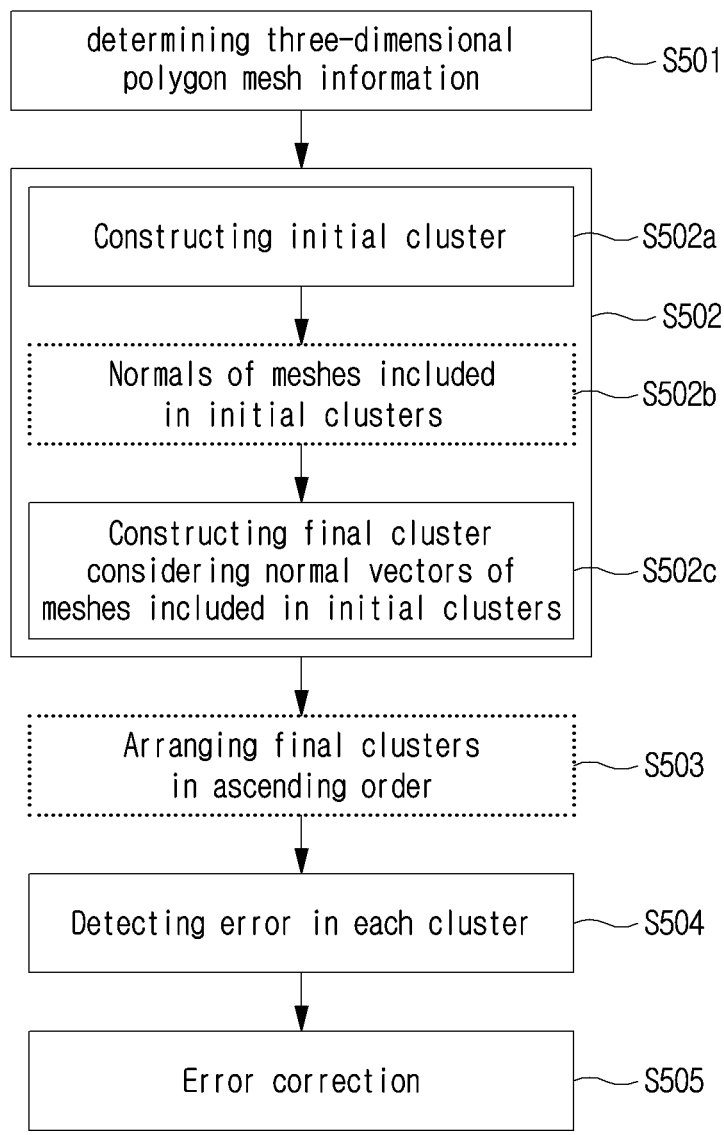
FIG. 5 is a flowchart illustrating an example of a sequence of a method of detecting an error in a mesh model according to an embodiment of the present disclosure.

FIG. 5 is a flowchart illustrating an example of a sequence of a method of detecting an error in a mesh model according to an embodiment of the present disclosure.

Referring to FIG. 5, the method of detecting the error in the mesh model may be performed by the apparatus for detecting the error in the mesh model.

First, at step S501, the apparatus for detecting the error in the mesh model may determine the three-dimensional polygon mesh information. The three-dimensional polygon mesh information may contain the data file used in printing of the three-dimensional object, and further, may contain the data file configured in the half-edge data structure.

For example, as shown in FIG. 2A, on the basis of the half-edge data structure, the predetermined object 200 may be expressed in a structure including: the vertices V1, V2, . . . , and Vn; the polygons P1, P2, . . . , and Pn; the meshes M1, M2, . . . , and Mn; and the half-edges H1, H2, . . . , and Hn. On the basis thereof, the apparatus for detecting the error in the mesh model may determine the three-dimensional polygon mesh information that contains information indicating the vertices V1, V2, . . . , and Vn, the polygons P1, P2, . . . , and Pn, the meshes M1, M2, . . . , and Mn, and the half-edges H1, H2, . . . , and Hn, namely, the vertex information, the polygon information, the mesh information, and the half-edge information.

Further, each mesh may represent a direction, and the direction of the mesh may be expressed using the normal vector. Accordingly, on the basis of the normal vector of each mesh, the half-edges H1, H2, . . . , and Hn of the relevant mesh may be determined.

For example, as shown in FIG. 2A, when the first mesh M1 is provided with the first direction 211, there may be the first half-edge H1 toward the first vertex V1 from the second vertex V2. Further, when the second mesh M2 adjacent to the first mesh M1 is provided with the second direction 212 similar to the first direction 211, there is the second half-edge H2 toward the second vertex V2 from the first vertex V1.

In contrast, as shown in FIG. 2B, the first half-edge H1 of the first mesh M1 may be the half-edge toward the first vertex V1 from the second vertex V2 as described above. Further, when the second' mesh M2' adjacent to the first mesh M1 is provided with the third direction 213 opposite to the first direction 211, the second' half-edge H2' is a half-edge toward the first vertex V1 from the second vertex V2.

At step S502, considering the above-described half-edge structure, the apparatus for detecting the error in the mesh model may perform clustering on each of one or more meshes. For example, the apparatus for detecting the error in the mesh model may determine the normal vector information on a per-mesh basis and may set a cluster including one or more meshes considering the normal vector information on a per-mesh basis.

Further, the apparatus for detecting the error in the mesh model may perform clustering in stages. That is, the apparatus for detecting the error in the mesh model may construct the initial cluster including one or more meshes first, and may construct the final cluster including one or more initial clusters second.

Specifically, the apparatus for detecting the error in the mesh model determines whether one or more meshes are connected to each other on the basis of the half-edge information on at least one mesh. Further, the apparatus for detecting the error in the mesh model may construct at least one initial cluster at step S502a applying whether one or more meshes are connected to each other.

For example, referring back to FIGS. 2A and 2B, when the first mesh M1 and the second mesh M2 adjacent thereto are provided with the same direction, the edge used in the two meshes in common is expressed as half-edges facing in different directions, and the relevant half-edges, namely, the first half-edge H1 and the second half-edge H2, may be grouped into one pair. In contrast, when the first mesh M1 and the second' mesh M2' adjacent thereto are provided with opposite directions, the edge used in the two meshes in common is expressed as half-edges facing the same direction, and the relevant half-edges, namely, the first half-edge H1 and the second' half-edge H2', are not grouped into one pair.

On the basis of this, the apparatus for detecting the error in the mesh model may construct the initial cluster by combining one or more meshes including half-edges grouped into one pair.

In the meantime, the apparatus for detecting the error in the mesh model may determine the initial clusters or the normal vectors of the meshes included in the initial clusters, and may construct the final cluster by merging or separating the initial clusters considering the determined normal vectors at step 502c.

For example, as shown in FIG. 3, there are multiple initial clusters 310, 320, 330, . . . , and each of the multiple initial clusters 310, 320, 330, . . . includes multiple meshes. The first initial cluster 310 is adjacent to the second initial cluster 320, and the region in which the first initial cluster 310 is in contact with the second initial cluster 320 is referred to as the boundary region 351. Considering this, the apparatus for detecting the error in the mesh model may determine, among multiple meshes included in the first initial cluster 310, one or more meshes 310a, 310b, and 310c that are in contact with the boundary region 351, and may determine, among multiple meshes included in the second initial cluster 320, one or more meshes 320a, 320b, 320c, and 320d that in contact with the boundary region 351. Also, the apparatus for detecting the error in the mesh model may determine the average value (also referred to as "the first average value") of normal vectors with respect to the meshes 310a, 310b, and 310c included in the first initial cluster 310, may determine the average value (also referred to as "the second average value") of the meshes 320a, 320b, 320c, and 320d included in the second initial cluster 320, and may determine the angle between the first average value and the second average value.

The apparatus for detecting the error in the mesh model may compare the determined angle with the preset reference value and may determine whether to construct the final cluster by merging the first initial cluster 310 and the second initial cluster 320 or to construct the final cluster by separating the first initial cluster 310 from the second initial cluster 320.

Further, the preset reference value may be set on the basis of distribution of the normal vectors of the meshes included in the initial cluster. The preset reference value is for setting initial clusters, which include meshes having similar normal vectors, as the same initial cluster, so it may be a reference value for merging adjacent initial clusters into a single final cluster. The preset reference value may be set using the minimum or maximum value of the angle between the normal vectors of one or more meshes included in the same cluster. As another example, the preset reference value may be set on the basis of the average value and the standard distribution of angles between normal vectors of one or more meshes included in the same cluster.

In the meantime, as described above, when the cluster is set, the apparatus for detecting the error in the mesh model may determine whether there is an error in every set cluster at step S504.

For example, the apparatus for detecting the error in the mesh model may determine the normal vector of at least one mesh included in the final cluster, and may determine for an error using the determined normal vector of the mesh. Specifically, the apparatus for detecting the error in the mesh model may select, among the meshes included in the final cluster, the mesh to be referenced (also, referred to as "the reference mesh"), and may extend the normal vector of the selected reference mesh. On the basis of the number of meshes that are in contact with the extending line from the normal vector of the reference mesh, whether there is an error in every final cluster may be determined. That is, when the number of meshes, which are in contact with the extending line from the normal vector of the reference mesh, is zero or an even number (2n), the apparatus for detecting the error in the mesh model determines that the relevant final cluster is in a normal direction. In contrast, when the number of meshes, which are in contact with the extending line from the normal vector of the reference mesh, is an odd number (2n+1), the apparatus for detecting the error in the mesh model determines that there is an error in the relevant final cluster.

Further, the apparatus for detecting the error in the mesh model may determine the mesh closest to the central region of the final cluster as the reference mesh. As another example, the apparatus for detecting the error in the mesh model may calculate the average value of the normal vectors of all meshes included in the final cluster, and may determine the mesh having the normal vector closest to the average value of the normal vector as the reference mesh.

Additionally, there may be multiple initial clusters, and the apparatus for detecting the error in the mesh model may construct the final cluster by merging or separating the multiple initial clusters. Preferably, the apparatus for detecting the error in the mesh model may further perform an operation of arranging the multiple initial clusters in ascending order on the basis of the number of meshes included in the initial clusters at step S502b. Also, the apparatus for detecting the error in the mesh model may determine the final cluster sequentially at step S502c with respect to the multiple initial clusters arranged in ascending order.

Similarly, there may be multiple final clusters, and the apparatus for detecting the error in the mesh model may determine sequentially whether there is an error in the multiple final clusters. Preferably, the apparatus for detecting the error in the mesh model may further perform an operation of arranging the multiple final clusters in ascending order on the basis of the number of meshes included in the initial clusters at step S503. Also, the apparatus for detecting the error in the mesh model may determine sequentially at step S504 whether there is an error in the multiple final clusters arranged in ascending order.

In the meantime, the apparatus for detecting the error in the mesh model may correct an error in the cluster that is determined as being in error at step S505. For example, the apparatus for detecting the error in the mesh model may determine the mesh of the cluster determined as being in error, and may change the order of the vertices that make up the relevant mesh, thereby correcting a flip of the mesh.

Figure 6:
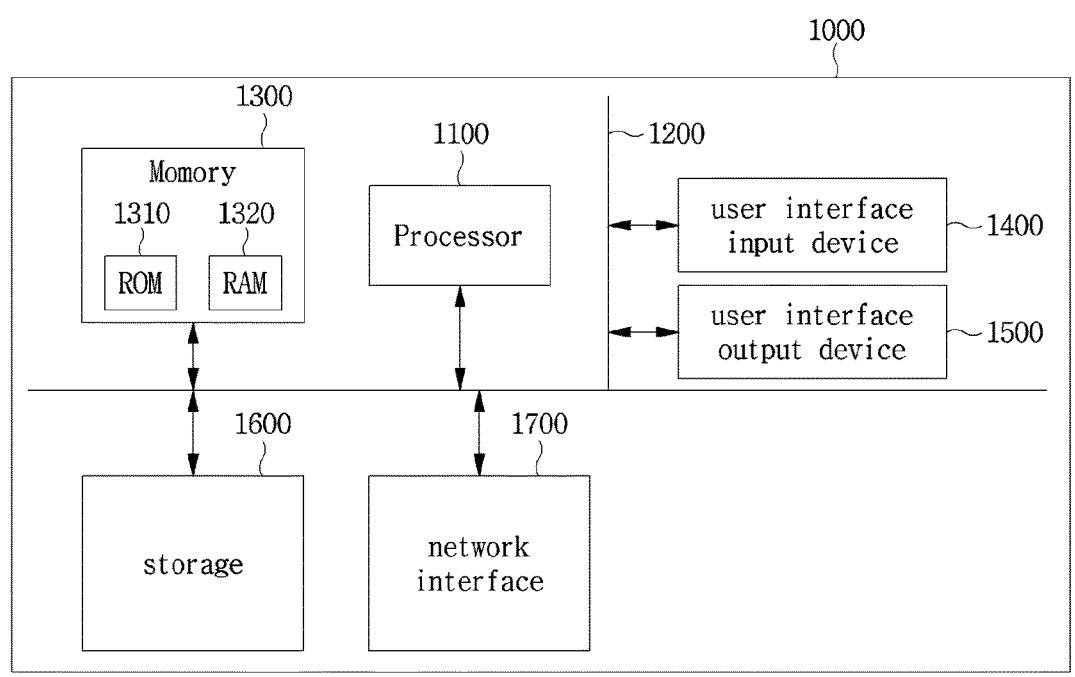
FIG. 6 is a block diagram illustrating an example of a computing system that executes a method and apparatus for detecting an error in a mesh model according to an embodiment of the present disclosure.

FIG. 6 is a block diagram illustrating an example of a computing system that executes a method and apparatus for detecting an error in a mesh model according to an embodiment of the present disclosure.

Referring to FIG. 6, a computing system 100 may include at least one processor 1100 connected through a bus 1200, a memory 1300, a user interface input device 1400, a user interface output device 1500, a storage 1600, and a network interface 1700.

The processor 1100 may be a central processing unit or a semiconductor device that processes commands stored in the memory 1300 and/or the storage 1600. The memory 1300 and the storage 1600 may include various volatile or non-volatile storing media. For example, the memory 1300 may include a ROM (Read Only Memory) and a RAM (Random Access Memory).

Accordingly, the steps of the method or algorithm described in relation to the embodiments of the present disclosure may be directly implemented by a hardware module and a software module, which are operated by the processor 1100, or a combination of the modules. The software module may reside in a storing medium (that is, the memory 1300 and/or the storage 1600) such as a RAM memory, a flash memory, a ROM memory, an EPROM memory, an EEPROM memory, a register, a hard disk, a detachable disk, and a CD-ROM. The exemplary storing media are coupled to the processor 1100 and the processor 1100 can read out information from the storing media and write information on the storing media. Alternatively, the storing media may be integrated with the processor 1100. The processor and storing media may reside in an application specific integrated circuit (ASIC). The ASIC may reside in a user terminal. Alternatively, the processor and storing media may reside as individual components in a user terminal.

The exemplary methods described herein were expressed by a series of operations for clear description, but it does not limit the order of performing the steps, and if necessary, the steps may be performed simultaneously or in different orders. In order to achieve the method of the present disclosure, other steps may be added to the exemplary steps, or the other steps except for some steps may be included, or additional other steps except for some steps may be included.

Various embodiments described herein are provided to not arrange all available combinations, but explain a representative aspect of the present disclosure and the configurations about the embodiments may be applied individually or in combinations of at least two of them.

Further, various embodiments of the present disclosure may be implemented by hardware, firmware, software, or combinations thereof. When hardware is used, the hardware may be implemented by at least one of ASICs (Application Specific Integrated Circuits), DSPs (Digital Signal Processors), DSPDs (Digital Signal Processing Devices), PLDs (Programmable Logic Devices), FPGAs (Field Programmable Gate Arrays), a general processor, a controller, a micro controller, and a micro-processor.

The scope of the present disclosure includes software and device-executable commands (for example, an operating system, applications, firmware, programs) that make the method of the various embodiments of the present disclosure executable on a machine or a computer, and non-transitory computer-readable media that keeps the software or commands and can be executed on a device or a computer.

Although a preferred embodiment of the present disclosure has been described for illustrative purposes, those skilled in the art will appreciate that various modifications, additions and substitutions are possible, without departing from the scope and spirit of the present disclosure as disclosed in the accompanying claims.

What is claimed is:

1. A method of detecting an error in a mesh model by a computing system including at least one processor and memory, the method comprising:
   determining, by the at least one processor, at least one mesh on the basis of half-edge information;
   setting, by the at least one processor, at least one cluster including the at least one mesh, on the basis of normal vector information on the at least one mesh;
   detecting, by the at least one processor, a flip error of the at least one cluster; and
   correcting, by the at least one processor, the at least one mesh in the at least one cluster in which the flip error is detected.

2. The method of claim 1, wherein the setting of the at least one cluster comprises:
   determining whether the meshes are connected to each other, on the basis of the half-edge information on the meshes; and
   generating at least one initial cluster applying whether the meshes are connected to each other.

3. The method of claim 2, wherein the setting of the at least one cluster comprises:
   constructing a final cluster by merging or separating the initial clusters, on the basis of the normal vector information on the meshes included in the initial clusters.

4. The method of claim 2, wherein the setting of the at least one cluster comprises:
   determining a number of the meshes included in each of the initial clusters; and
   arranging the initial clusters in ascending order on the basis of the number of the meshes.

5. The method of claim 2, wherein the setting of the at least one cluster comprises:
   determining an angle between at least one first normal vector corresponding to the at least one mesh included in a first initial cluster and at least one second normal vector corresponding to the at least one mesh included in a second initial cluster that is different from the first initial cluster; and
   merging the first and second initial clusters considering the angle between the at least one first normal vector and the at least one second normal vector.

6. The method of claim 5, wherein the merging of the first and second initial clusters comprises:
   determining the angle between the at least one first normal vector and the at least one second normal vector; and
   merging the second initial cluster into the first initial cluster as the angle has a value that is relatively larger than a preset minimum reference value and is relatively smaller than a preset maximum reference value.

7. The method of claim 3, wherein the setting of the at least one cluster comprises:
   determining a number of the meshes included in each of the final clusters; and
   arranging the final clusters in ascending order on the basis of the number of the meshes.

8. The method of claim 7, wherein the detecting of the flip error of the at least one cluster comprises:
   determining a normal vector of the at least one mesh included in the at least one final cluster;
   determining a number of the other meshes that are in contact with an extending line from the normal vector; and
   determining the flip error in the at least one final cluster considering the determined number.

9. The method of claim 8, wherein the determining of the normal vector of the at least one mesh included in the at least one final cluster comprises:
   determining the normal vector of the mesh positioned at a central region of each of the final clusters.

10. The method of claim 8, wherein the determining of the normal vector of the at least one mesh included in the at least one final cluster comprises:
    determining an average value of the normal vectors of the meshes included in each of the final clusters; and
    determining the normal vector of the mesh, which corresponds to the average value of the normal vectors of the meshes.

11. The method of claim 8, wherein at the determining of the flip error in the at least one final cluster considering the determined number,
    determining that the at least one final cluster is normal when the number of the meshes, which are in contact with the extending line from the normal vector, is zero or an even number, and
    determining that the flip error is present in the at least one final cluster when the number of the meshes, which are in contact with the extending line from the normal vector, is an odd number.

12. An apparatus for detecting an error in a mesh model, the apparatus comprising:
    a mesh determining unit determining at least one mesh on the basis of half-edge information;
    a clustering processing unit setting at least one cluster including the at least one mesh, on the basis of normal vector information on the at least one mesh;
    an error detecting unit detecting a flip error of the at least one cluster; and
    an error correcting unit correcting the at least one mesh in the at least one cluster in which the flip error is detected.

13. The apparatus of claim 12, wherein the clustering processing unit is configured to:
    determine whether the meshes are connected to each other, on the basis of the half-edge information on the meshes; and
    generate at least one initial cluster applying whether the meshes are connected to each other.

14. The apparatus of claim 13, wherein the clustering processing unit is configured to:
    construct a final cluster by merging or separating the initial clusters, on the basis of the normal vector information on the meshes included in the initial clusters.

15. The apparatus of claim 13, wherein the clustering processing unit is configured to:
    determine a number of the meshes included in each of the initial clusters; and
    arrange the initial clusters in ascending order on the basis of the number of the meshes.

16. The apparatus of claim 13, wherein the clustering processing unit is configured to:
    determine an angle between at least one first normal value corresponding to the at least one mesh included in a first initial cluster and at least one second normal value corresponding to the at least one mesh included in a second initial cluster that is different from the first initial cluster; and
    merge the first and second initial clusters considering the angle between the at least one first normal vector and the at least one second normal vector.

17. The apparatus of claim 16, wherein the clustering processing unit is configured to:
  determine the angle between the at least one first normal vector and the at least one second normal vector; and
  merge the second initial cluster into the first initial cluster as the angle has a value that is relatively larger than a preset minimum reference value and is relatively smaller than a preset maximum reference value.

18. The apparatus of claim 14, wherein the clustering processing unit is configured to:
  determine a number of the meshes included in each of the final clusters; and
  arrange the final clusters in ascending order on the basis of the number of the meshes.

19. The apparatus of claim 18, wherein the error detecting unit is configured to:
  determine a normal vector of the at least one mesh included in the at least one final cluster;
  determine a number of the other meshes that are in contact with an extending line from the normal vector; and
  determine the flip error in the at least one final cluster considering the determined number.

20. The apparatus of claim 19, wherein the error detecting unit is configured to:
  determine that the at least one final cluster is normal as the number of the meshes, which are in contact with the extending line from the normal vector, is zero or an even number; and
  determine that the flip error is present in the at least one final cluster as the number of the meshes, which are in contact with the extending line form the normal vector, is an odd number.

* * * * *